(12) United States Patent
Blair et al.

(10) Patent No.: US 7,934,951 B2
(45) Date of Patent: May 3, 2011

(54) TWO MOUNT AND THREE MOUNT SOCKET DESIGN WITH ATTACHMENT AND ALIGNMENT

(75) Inventors: James L Blair, Ramona, CA (US); Robert L Welcomer, Jr., San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/543,373

(22) Filed: Aug. 18, 2009

(65) Prior Publication Data

US 2010/0124827 A1   May 20, 2010

Related U.S. Application Data

(60) Provisional application No. 61/090,085, filed on Aug. 19, 2008.

(51) Int. Cl.
*H01R 13/73*    (2006.01)

(52) U.S. Cl. ........................................ 439/573

(58) Field of Classification Search ............... 439/331, 439/573, 569, 571, 564
See application file for complete search history.

(56) References Cited

U.S. PATENT DOCUMENTS

| | | | | |
|---|---|---|---|---|
| 3,605,075 | A | * | 9/1971 | Stofkooper ............... 439/525 |
| 5,127,837 | A | * | 7/1992 | Shah et al. ............... 439/71 |
| 5,232,372 | A | | 8/1993 | Bradley et al. |
| 5,531,603 | A | * | 7/1996 | Kubo et al. ............... 439/72 |
| 5,833,472 | A | | 11/1998 | Bright |
| 5,881,453 | A | * | 3/1999 | Avery et al. ............... 29/834 |
| 6,325,638 | B1 | | 12/2001 | Chapin et al. |
| 6,533,589 | B1 | * | 3/2003 | Palaniappa et al. ............. 439/71 |
| 6,607,396 | B1 | * | 8/2003 | Ito ............... 439/331 |
| 7,335,030 | B2 | | 2/2008 | Kunioka et al. |

OTHER PUBLICATIONS

International Search Report—PCT/US2009/054356, International Search Authority—European Patent Office—Jan. 12, 2009.

* cited by examiner

*Primary Examiner* — Phuong K Dinh
(74) *Attorney, Agent, or Firm* — William M. Hooks (57) ABSTRACT

Various socket configurations having coaxial alignment and attachments are disclosed. The various socket configurations can use two-mount and three-mount configurations to facilitate adaptability to high density routing.

24 Claims, 6 Drawing Sheets

FIG. 5A Rectangular Pattern

FIG. 5B Raduis Pattern

"Outrigger" Configurations

TWO MOUNT AND THREE MOUNT SOCKET DESIGN WITH ATTACHMENT AND ALIGNMENT

CLAIM OF PRIORITY UNDER 35 U.S.C. §119

The present application for patent claims priority to Provisional Application No. 61/090,085 entitled "Two-Mount and Three-Mount Socket Design with Coaxial Attachment and Alignment" filed Aug. 19, 2008, and assigned to the assignee hereof and hereby expressly incorporated by reference herein.

FIELD OF DISCLOSURE

Embodiments of the invention are related to sockets for mounting integrated circuits. In particular embodiments of the invention are directed to socket configurations having coaxial attachment and alignment means.

BACKGROUND

Sockets are used in many environments to facilitate the attachment of integrated circuit chips or packages to various printed circuit boards (PCBs). As is known, a PCB can be used to mechanically support and electrically connect electronic components via traces that are embedded in a laminated non-conductive substrate (including one or more layers). PCBs may also be named printed wiring board (PWB), etched wiring board, and like variations. Sockets for mounting electronic devices such as integrated circuit chips/packages (generally referred herein as ICs) may be mounted to the PCB, while the IC is inserted into the socket. In contrast to soldering or other direct mounting techniques of the IC, an IC that is mounted in a socket can be easily disconnected from the printed circuit board following test and/or replacement. However, the relatively dense layout and small size of electrical contacts on modern ICs means that precise alignment both between the socket and the printed circuit board and between the IC and the socket is needed to ensure consistent connection of all the pins of the IC.

Figure 1:
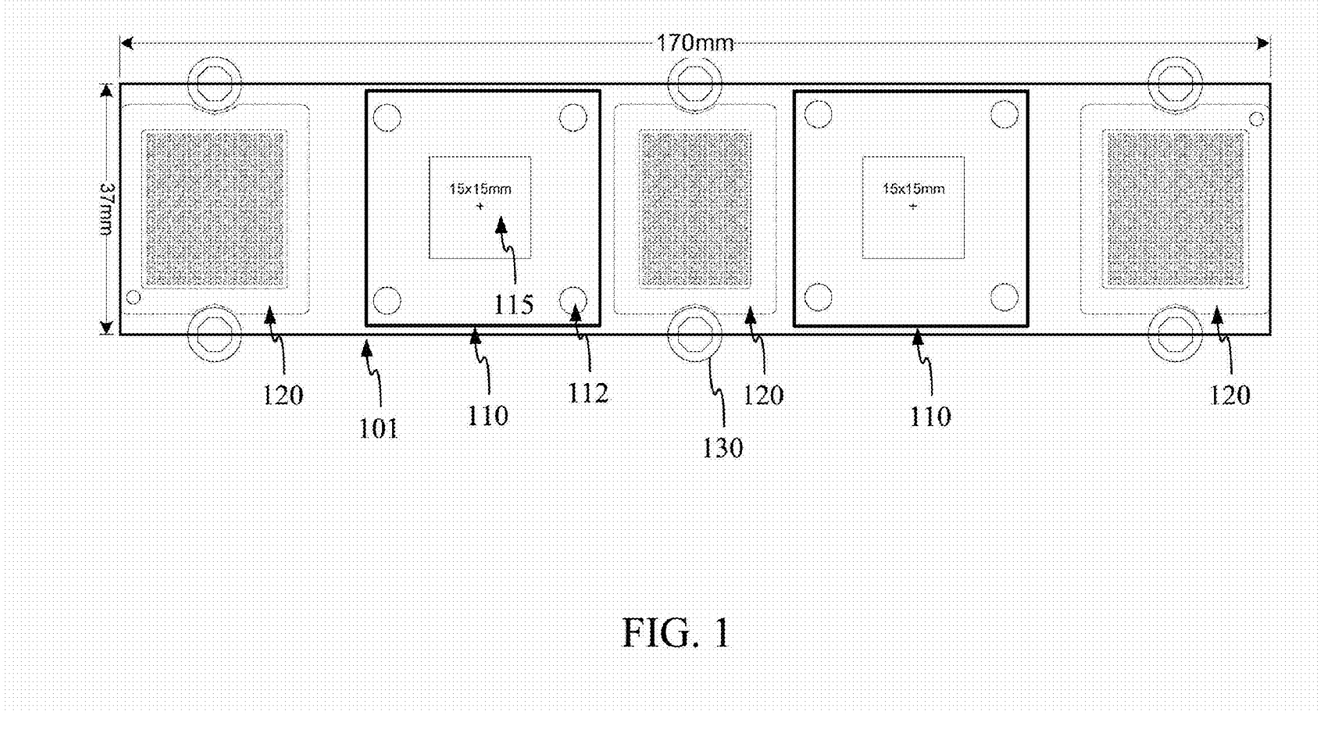
FIG. 1 is an illustration of conventional mounting configuration including a conventional socket arrangement.

FIG. 1 illustrates a conventional socket and mounting arrangement. The socket 110 is illustrated in a conventional rectangular configuration. The socket has four mounting points 112 that are used to mechanically attach the socket to PCB 101. Socket alignment is traditionally facilitated by small dowel pins embedded in the socket body and passed through PCB receiving holes to achieve precise socket to board alignment (not shown). The actual mounting hardware is not shown in FIG. 1, but may be bolts, screws or other conventional hardware as is well known. The IC 115 can be mounted in the center of socket 110.

The socket can be mounted directly to PCB 101 which may be the ultimate connecting point or may be mounted to a daughter card or test board as illustrated. For example, in a daughter card configuration, the PCB 101 may have connector pin fields 120 to mount to a motherboard or test board. Additional mounting locations 130 can be used to mount PCB 101 to the motherboard. As will be appreciated, whether mounted to PCB that is a standalone board or mounted to a daughter board that makes connections through the connector pin field 120, a substantial amount of connections are made to the IC. Although the socket mount locations provide for stability and guide pins socket alignment, there is limited adaptability for high density routing requirements of modern ICs which have from hundreds to more than a thousand pin connections and may have both low and high frequency connections.

SUMMARY

Exemplary embodiments of the invention are directed to socket configurations having coaxial alignment and attachment means and use two and three mount configurations to facilitate adaptability to high density routing.

Accordingly an embodiment of the invention can include a coaxial mount socket comprising: first and second mount portions forming opposing ends of the socket, each mount portion including: an upper portion having a threaded cavity and a protruding top portion configured to be used for alignment; and a lower portion having a bored area and an outer surface configured to be used for alignment.

Another embodiment can include an apparatus comprising a coaxial mount socket and a printed circuit board. The coaxial mount socket has first and second mount portions forming opposing ends of the socket, each mount portion including: an upper portion having a threaded cavity and a protruding top portion configured to be used for alignment; and a lower portion having a bored area and a lower alignment surface. The coaxial mount socket is mounted and aligned to the printed circuit board via the lower portion.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Further, the dimensions illustrated and applications discussed herein are merely for illustration of embodiments of the invention and do not limit the invention to these specific examples. In the figures, the thickness, widths and areas of various layers and structures may be enlarged for the purposes of illustration and/or clarity. Additionally, when layers, films, areas and plates formed on other elements are illustrated, it may not exclude other elements interposed therebetween. Still further, the terms "connect", "connected", "connection", "couple", "coupled" and variations thereof, do not require that the elements be directly connected (i.e., having no intervening elements) and also do not exclude that the elements may be connected directly.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 2A:
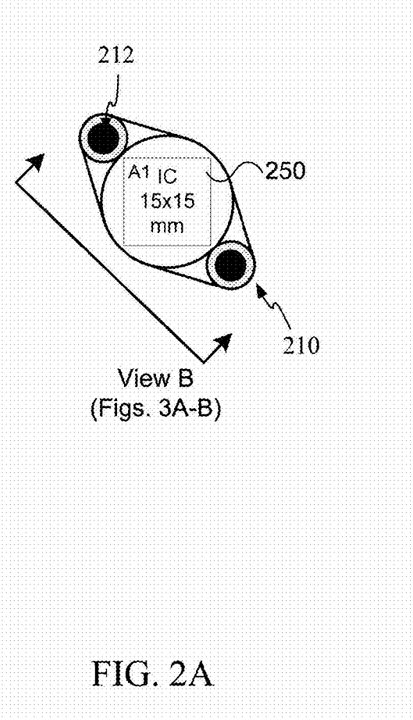
FIG. 2A is an illustration of a top view of a two-mount socket design.

FIG. 2A illustrates a top view of a two-mount socket 210 or "kayak" configuration. The socket 210 includes coaxial mounting and alignment elements 212. The socket 210 can have IC 250 located in the center of the socket. The IC pin "A1" index may be assigned any orientation with respect to the socket mounting/alignment means. However, once fixed in relation to the PCB system, the "A1" location is usually deemed invariant. A side view "View B" will be described further in FIGS. 3A and 3B. The illustrated arrangement of the two-mount socket 210 is illustrated with elements 212 positioned closely to the perimeter of the central mounting location of socket 250.

Figure 2B:
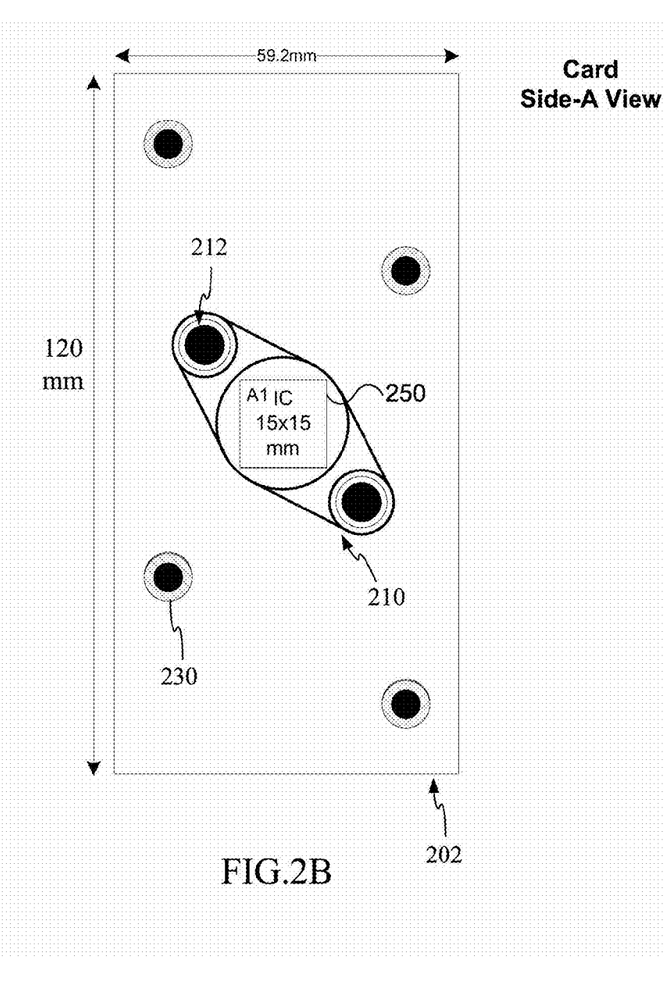
FIG. 2B is an illustration of a plan view of a two-mount socket design mounted to a PCB.

FIG. 2B illustrates a two-mount configuration mounted to a PCB 202. In FIG. 2B, the two-mount socket 210 is illustrated with an alternative spacing of mounting elements 212. It will be appreciated that the specific spacing may be adjusted based on the many factors and are not limited to any specific arrangement. Also, as illustrated the PCB 202 has additional mounting locations/elements 230, which may be used to mount the assembly to a mechanical support/housing or to a motherboard if PCB 202 is configured as a daughterboard.

Figure 2C:
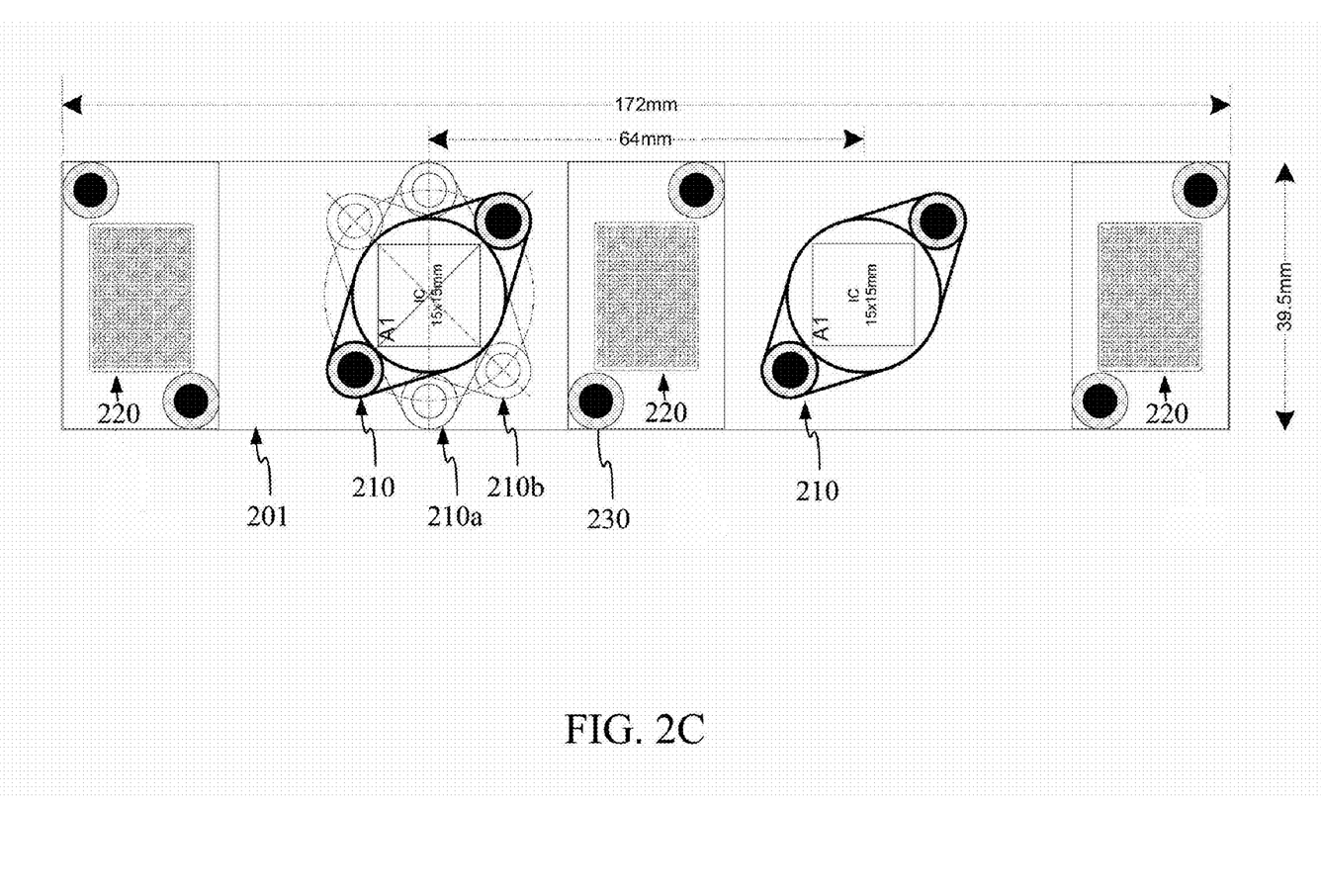
FIG. 2C is an illustration of mounting configuration including a two-mount socket arrangement and orientation.

FIG. 2C is an illustration of the PCB assembly having the two-mount socket used in a similar configuration as that illustrated in FIG. 1. As illustrated, the two-mount socket can have a variety of mounting arrangements in relation to the PCB 201. For example, socket 210 can be rotated and mounted in alternative positions 210a or 210b or any other position relative to A1, which can provide flexibility in mounting and routing, particularly in relation to high density routing areas. It should be noted that the "A1" orientation of the IC does not change as the mount is configured in the 210a or 210b arrangement. Accordingly, depending on both the pin arrangement of the IC and the routing to the pins on the IC, any corner of the IC can be freed from having mounting hardware which limits the routing area and options.

The socket can be mounted directly to PCB 201 which may be the ultimate connecting point or may be mounted to a daughter card or test board as illustrated. For example, in a daughter card configuration, the PCB 201 may have connector pin fields 220 to mount to a motherboard or test board, similar to FIG. 1. Additional mounting locations 230 can be used to mount PCB to the motherboard. As will be appreciated, whether mounted to a PCB that is a standalone board or mounted to a daughter board that makes connections through the connector pin field 220, a substantial amount of connections are made to the IC. Accordingly, embodiments of the invention provide adaptability for high density routing requirements of modern ICs which have hundreds of pin connections and may have both low and high frequency connections. Further, it will be appreciated that in the two IC configurations illustrated, the mounting orientation of each socket 210 may be different for each location. For example, since the center connector pin field 220 may be shared between ICs on either side of the center pin field, the routing density may be less on a side adjacent that connector. Accordingly, sockets 210 may be arranged so that the mounting portions are in a mirror image of each other.

As noted above, prior art socket mount locations provide for stability and socket guide pins for alignment. As such there is limited adaptability for high density routing requirements of modern ICs which have from hundreds to more than a thousand pin connections and may have both low and high frequency connections. As noted above, the IC pin "A1" index may be assigned any orientation with respect to the socket mounting/alignment means. However, once fixed in relation to the PCB system, the "A1" location is usually deemed invariant. Depending on both the pin arrangement of the IC and the routing to the pins on the IC, using embodiments of the socket disclosed herein, any corner of the IC can be freed from having mounting hardware. Areas having mounting hardware limit the routing area and options for routing. In the two-IC configuration illustration of FIG.-2C, the mounting orientation of each socket 210 may be different for each location to facilitate routing to a desired connector or portion of connector.

Figure 3A:
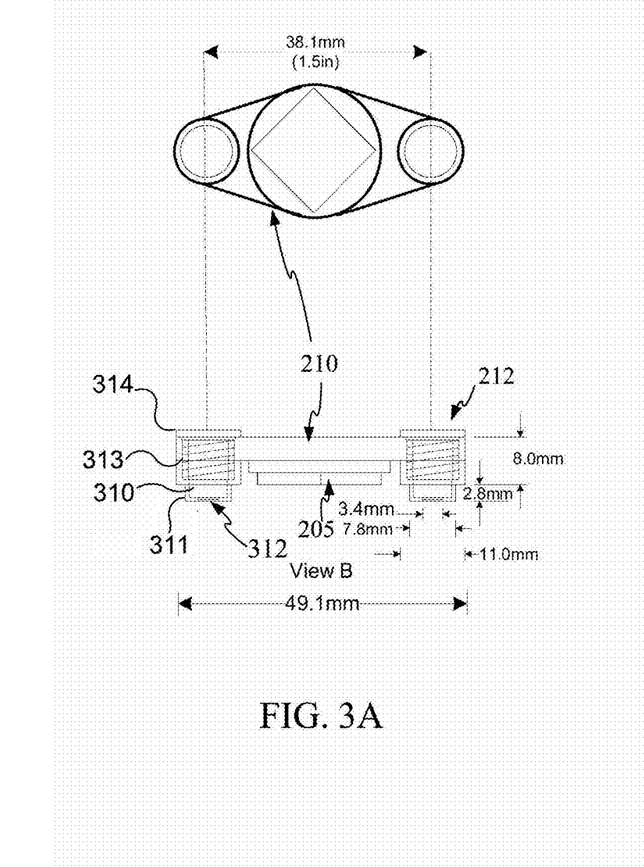
FIG. 3A is an illustration of side view of a two-mount socket arrangement.

FIG. 3A illustrates a side view of a two-mount socket embodiment 210 showing additional aspects of the two-mount socket. As illustrated, insert 205 can be used to interface the PCB and the IC and may have spring loaded pins or other similar resilient conductive elements that are used to couple the pins of the IC to contact points on the PCB. Plastic or other non-conducting material may be used for insert 205 to insulate pin contacts and may also provide insulation when socket 210 is made in part of metal or other conducting materials. It will be appreciated that socket 210 may be made of any material that can provide a substantially rigid mounting to the PCB, such that the alignment of the IC is not compromised. For example, a metal socket 210 may include a plastic insert 205 and may be used for a test adapter where a high volume of ICs (or devices under test) may be inserted and removed from socket 210. It should be noted that in some embodiments the socket underside clearance areas may be set to accommodate PCB top surface mounted component placement beneath the outline of the socket outside of socket regions contacting the PCB directly. Another aspect of the disclosed socket embodiments allows for PCB top surface mounted components to be placed in close proximity to the outer row of socket pins, in areas where no mounting hardware is located, facilitating critical radio frequency (RF) part placement and conductor wiring.

The coaxial attachment and alignment aspects of embodiments of the invention are also illustrated in FIG. 3A. Bore 310 is provided as a clearance cavity that allows for a head of a first fastener to penetrate into the socket mounting/alignment portion 212 for mounting. Outer surface 311 at least partially enclosing bore 310 can be used to align the socket to the PCB. A hole 312 penetrating through the bottom portion of mount portion 212 allows for the shaft of the first fastener to penetrate into a device the socket is mounted to (e.g., PCB 201). A threaded cavity 313 is located near a top portion of the socket 210 and can be used to secure a top element to socket 210 using a second fastener. A protruding portion 314 may be used for alignment purposes to align the top element with socket 210. The first and second fastener may be of the commercially available variety to reduce hardware expense in cost sensitive applications. Conversely, if socket volume is a critical limitation, custom fasteners with their customized size may be utilized. Further, socket to PCB footprint contact may be reduced by narrowing outer diameter 311 (not shown) to enclose only a portion of the shaft of the first fastener leaving its head to remain above the PCB top surface while continuing to provide socket alignment. Once again the illustrated arrangement and dimensions are provided solely to aid in understanding embodiments of the invention and are not to be construed as limiting embodiments of the invention to the illustrated features.

Figure 3B:
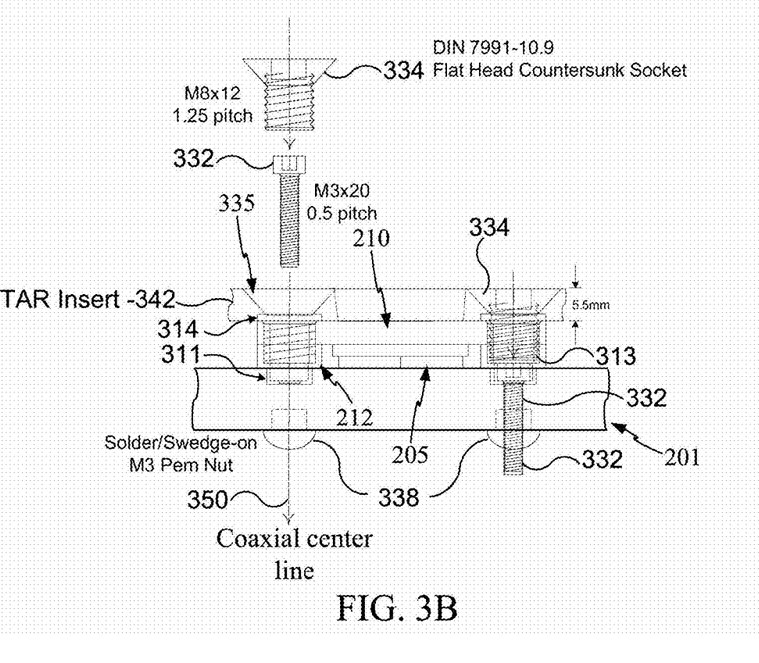
FIG. 3B is an illustration of cross sectional view of a mounting configuration including a two-mount socket arrangement with coaxial attachment and alignment.

FIG. 3B illustrates a configuration of the two-mount socket 210 as mounted using the coaxial attachment and alignment aspects of embodiments of the invention. In this illustration, embodiments of the invention are illustrated using conventional mounting hardware. For example, fastener (e.g., a socket head cap screw) 332 can be used to mount socket 210 to PCB 201. A nut 338 (e.g., pem nut) may be mounted to the bottom of PCB 201 where it functions to receive fastener 332 for securing socket 210 to PCB 201. Outer diameter 311 of the mounting portion of the socket 210 is used as an alignment means between the socket 210 and a corresponding recessed/counterbored portion of PCB 201. A top device 342 (e.g., test adapter ring (TAR) can be mounted and aligned to the socket 210, also using the coaxial mounting and alignment aspects of socket 210. A second fastener 334 (e.g., a flat head countersunk socket screw) can be threaded into threaded cavity 313 to mount a top mounting device 342 to the two-mount socket 210. Device 342 may have a countersunk portion 335 to receive fastener 334. Top alignment portion 314 can be used to align device 342 with the socket 210. It will be appreciated that elements 334, 332, 314, 313, 311 and 338 are all aligned along the coaxial center line 350, which allows for consistent alignment between the socket 210 and the various elements it is coupled to. The right side of FIG. 3B illustrates the configuration with fasteners 332 and 334 installed. In this example, fastener 332 is recessed in cavity 310 (as illustrated in FIG. 3A) and threaded cavity 313 is designed such that fastener 334 when fully inserted does not contact the fastener 332. Therefore, the socket 210 can have independent mounting means sharing mounting/alignment portion 212. An alternative embodiment can include a configuration where fastener 332 can attach to socket 210 from the bottom-side of PCB 201. Socket hole 312 and recess 310 are replaced with a threaded hole (not shown) sufficient to accept the threaded shaft of fastener 332. In this embodiment, nut 338 is eliminated and the threaded shaft of fastener 332 or any other suitable fastener is passed through the bottom side of PCB 201 and threaded into mounting and alignment element 212. The length of first fastener 332 and that of the second fastener 334 are sufficiently short as not to contact each other when fully engaged in socket 210.

Accordingly, it will be appreciated that embodiments of the invention allow for both alignment and fastening of multiple devices to socket 210 in multiple configurations using conventional hardware, as illustrated, and including like adaptors (e.g., "FA Cookies") used for IC die probing.

Traditional 4-mount sockets can benefit as well from combining guide-pin and mounting functions detailed in this disclosure as a way to obviate the need for separate circuit board keep-out regions around socket alignment pins. Embodiments of the invention provide combined alignment and mounting features. For example, socket 210 may include coaxial mounting and alignment elements 212. Bore 310 may be provided as a clearance cavity that allows for a head of a first fastener to penetrate into the socket mounting/alignment portion 212 for mounting. Outer diameter 311 adjacent to bore 310 can be used to align the socket to the PCB. Hole 312 penetrating through the bottom portion of mount portion 212 allows for the shaft of the first fastener to penetrate into a device the socket is mounted to (e.g., PCB 201). A threaded cavity 313 is located near a top portion of the socket 210 and can be used to secure a top element to socket 210 using a second fastener. A protruding portion 314 may be used for alignment purposes to align the top element with socket 210. It will be appreciated that elements 334, 332, 314, 313, 311 and 338 may all be aligned along the coaxial center line 350, which allows for consistent alignment between the socket 210 and the various elements it is coupled to.

Further, a significant problem with non-coaxial alignment/mount socket design is the application of device under test (DUT) socket-to-load board (LB) 'down' and DUT socket-to-test adaptor ring (TAR) 'up' forces to the socket body of non co-located DUT-Socket-TAR attachment hardware. The linear separation of these opposing forces produces a moment arm resulting in a torque in proportion to force separation distance. Embodiments of the invention serve to combine both the socket/LB and socket/TAR mounting and guide pin functions through the use of guide-tubes and in-line screw hardware. Opposing LB-to-TAR forces are placed coaxial to each other to eliminate the torque force and resultant socket bowing.

Accordingly an embodiment of the invention can include a coaxial mount socket 210 having first and second mount portions (e.g., 212) forming opposing ends of the socket 210. Each mount portion can include an upper portion having a threaded cavity (e.g., 313) and a protruding top portion (e.g., 314) configured to be used for alignment. Further, each mount portion can have a lower portion having a bored area (e.g., 310), an outer surface (e.g., 311) configured to be used for alignment and a hole (e.g., 312) penetrating through the lower portion.

Figures 4A, 4B:
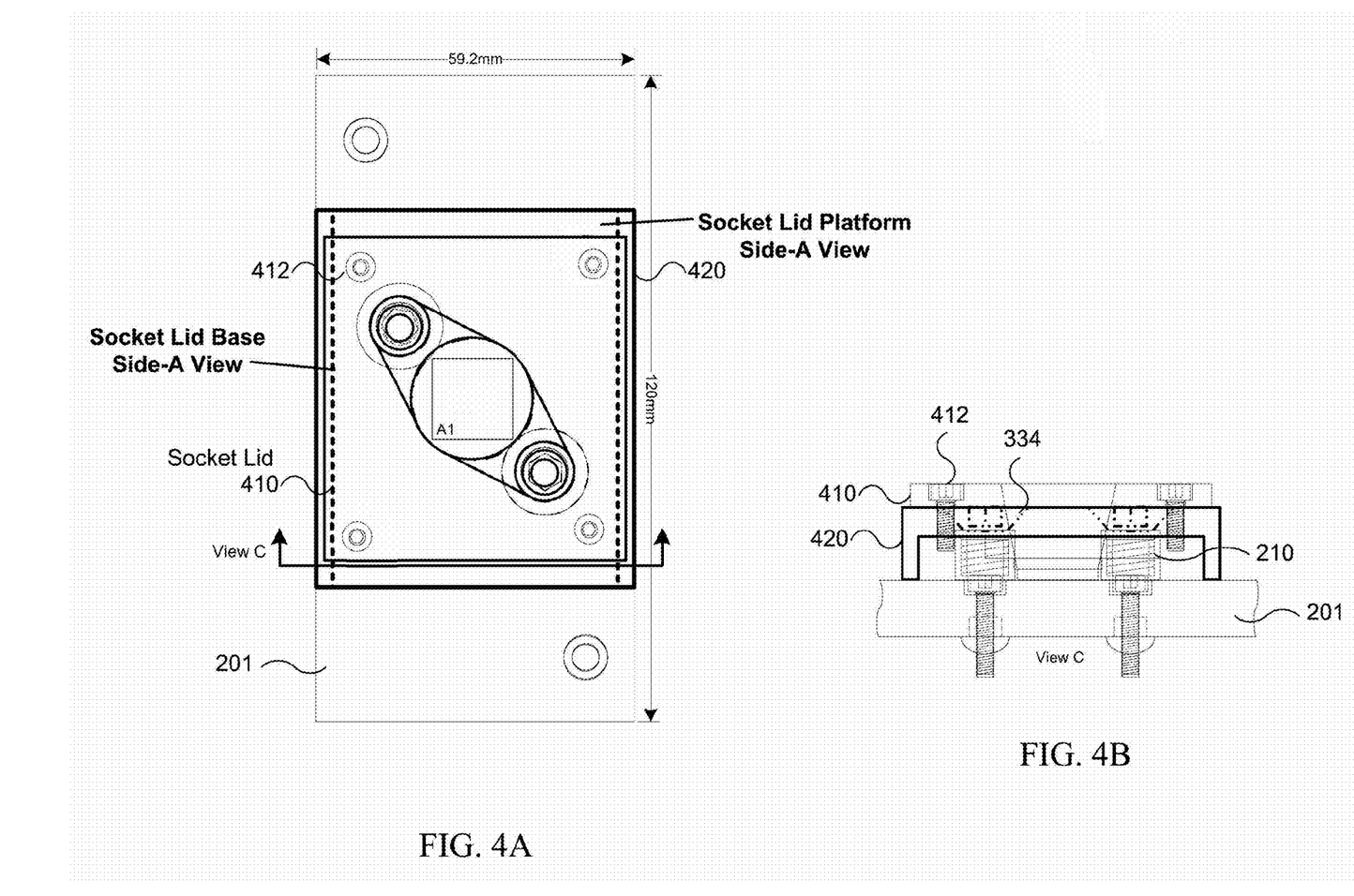
FIG. 4A is an illustration of top view of a circuit board assembly with a two-mount socket arrangement, (optional) assembly stabilizer for manual IC insertion, and manual IC insertion socket base.
FIG. 4B is an illustration of cross sectional view of a circuit board assembly with a two-mount socket arrangement.

FIGS. 4A and 4B illustrate an arrangement of the two-mount socket in a manual insertion test configuration. An optional support bracket 420 illustrated as a U-shaped channel for use in high-impact application environments can be coupled to the top of socket 210 using a similar mounting configuration as illustrated in FIGS. 3A and 3B. The socket lid with base 410 (lid not shown for clarity) can be used to cover the IC (device under test) for manual insertion and extraction in the illustrated configuration. Fasteners 412 can be used to secure the lid base 410 to the bracket 420. In less physically demanding applications the U-shaped channel may be omitted and the socket lid and base mounted directly to socket 210. Accordingly, it will be appreciated that socket 210 can be used with a test adapter ring (such as illustrated in FIG. 3B) in an automated test environment and can also be used in a manual test configuration as illustrated in FIGS. 4A and 4B.

Figure 5A:
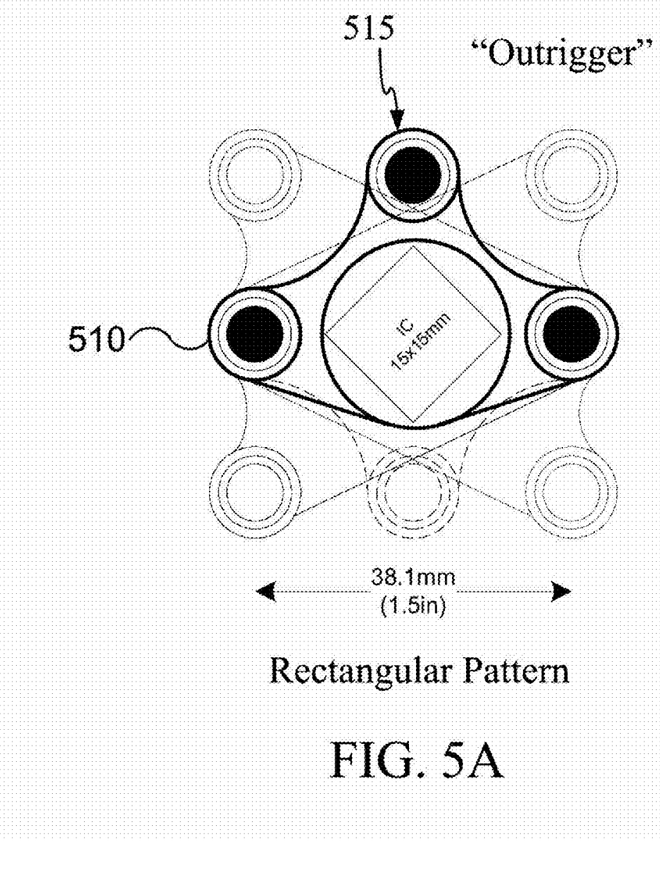
FIG. 5A is an illustration of a top view of a three-mount socket design having a rectangular pattern.
Figure 5B:
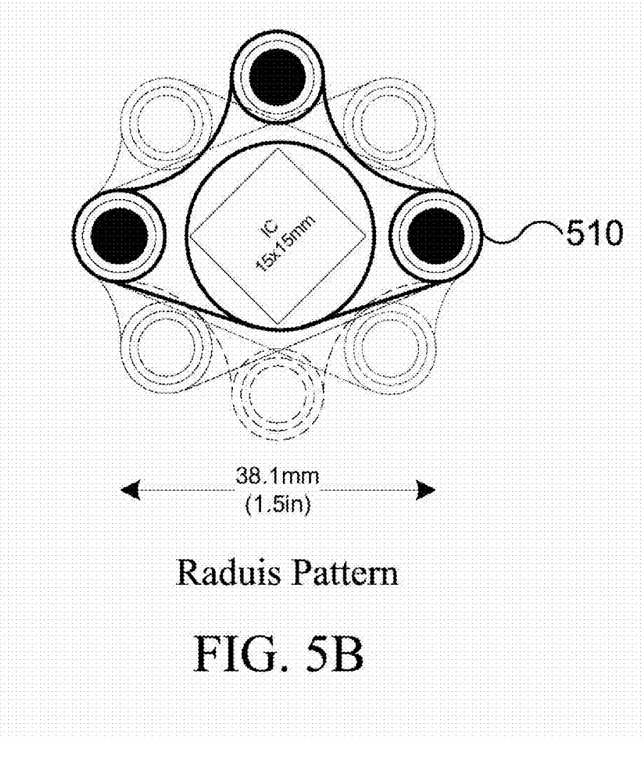
FIG. 5B is an illustration of a top view of a three-mount socket design having a radius pattern.

FIGS. 5A and 5B illustrate embodiments of a three-mount or "outrigger" socket. The three-mount design of FIG. 5A can be arranged in a rectangular configuration and could be made to correspond to a three-out-of-four "conventional" rectangular mount pattern, such as illustrated in FIG. 1. In this manner, the "outrigger" mount can supplant thereof the four mounts of a regular square or rectangular socket. In the radius pattern of FIG. 5B, all the mounts may be positioned on a given radius. It will be appreciated that these arrangements are provided merely for illustration and are not intended to limit embodiments of the invention. For example, the outrigger portion 515 or any other portion may be spaced at different distances from the center of socket 510, as needed to facilitate routing and/or mechanical connection.

Additionally, it will be appreciated that the three-mount designs of FIGS. 5A and 5B, will also have the co-axial mount aspects (e.g., such as illustrated FIGS. 3A-3B). In either socket type (two-mount or three-mount), the term "coaxial" mount is used herein to refer to a combined socket-to-PCB alignment, and a socket-to-PCB attachment. The term "coaxial" mounting can also refer to the optional aspect of a socket-to-superstructure connection (e.g., the TAR insert 342 of FIG. 3B). In the three-mount socket configuration, at least two opposed mounts will be provisioned with coaxial mounting (e.g., guide/alignment) features. In some embodiments, the third mount 515 (e.g., the 'outrigger' pontoon) may not have the coaxial guide/alignment feature of the other two mounting portions for mechanical tolerance reasons. However, in other embodiments all three mounting portions may have the coaxial mounting features.

It will be appreciated that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A mount socket for an integrated circuit package comprising:
   first and second mount portions forming opposing ends of the socket, each mount portion including:
      an upper portion having a threaded cavity and a protruding top portion configured to be used for alignment; and
      a lower portion having a bored area and an outer surface configured to be used for alignment.

2. The socket of claim 1, wherein the first and second mount portions are approximately 180 degrees apart.

3. The socket of claim 1, wherein the lower portion has a smaller diameter than the upper portion.

4. The socket of claim 1, wherein the bore area is configured to accept a head of a fastener and wherein the lower portion includes a hole penetrating through the lower portion configured to pass the shaft of the fastener.

5. The socket of claim 1, wherein the socket body is made of metal and further comprise a central insulator insert to couple to an integrated circuit.

6. The socket of claim 5, wherein the central insulator insert is formed of a plastic material.

7. The socket of claim 5, wherein the central insulator insert has an A1 index position and wherein the mount portions are located at an arbitrary position in both radius and angle from the A1 index position.

8. The socket of claim 1, further comprising:
   a third mount portion.

9. The socket of claim 8, wherein the third mount portion is configured without any alignment surfaces.

10. The socket of claim 8, wherein the third mount portion is located in an arbitrary position in both radius and angle between the first and second mount portions.

11. The socket of claim 10, wherein the third mount portion is located in one mounting location of a conventional four-mount layout and the first and second mount portions are located at other locations of the conventional four-mount layout.

12. The socket of claim 1, wherein the upper portion is adapted to couple to a top element via the threaded cavity and to align to the top element via the protruding top portion.

13. The socket of claim 12, wherein the top element is at least one of a test adapter ring, a socket lid or a support bracket.

14. The socket of claim 1, wherein the bore area is threaded and configured to accept a fastener from a side opposite the upper portion.

15. The socket of claim 1, wherein for each mount portion the threaded cavity and bored area are aligned along a common center line in a direction perpendicular to the opening of the threaded cavity.

16. An apparatus comprising:
   a mount socket for an integrated circuit package having first and second mount portions forming opposing ends of the socket, each mount portion including:
      an upper portion having a threaded cavity and a protruding top portion configured to be used for alignment; and a lower portion having a bored area and a lower alignment surface; and a printed circuit board, wherein the coaxial mount socket is mounted and aligned to the printed circuit board via the lower portion.

17. The apparatus of claim 16, wherein the printed circuit board has at least two recess portions in an upper surface configured to receive the lower alignment surfaces of the coaxial mount socket.

18. The apparatus of claim 16, wherein the printed circuit board has at least one connector pin field to allow further connection to a test unit.

19. The apparatus of claim 18, wherein the upper portion is coupled to a test adapter ring via the threaded cavity and aligned to the test adapter ring via the protruding top portion.

20. The apparatus of claim 19, wherein for each mount portion, fasteners securing the printed circuit board to the lower portion and the test adapter ring to the upper portion are aligned along a common coaxial center line.

21. The apparatus of claim 19, wherein the socket is made of metal and includes a central insulator insert to couple to a device under test to the printed circuit board.

22. The apparatus of claim 21, wherein the central insulator insert is formed of a plastic material and has resilient conductive elements that are used to couple the pins of the device under test to contact points on the printed circuit board.

23. The apparatus of claim 16, wherein the bore area is configured to accept a head of a fastener, wherein the lower portion includes a hole penetrating through the lower portion configured to pass the shaft of the fastener, and wherein the fastener attaches the printed circuit board to the socket.

24. The apparatus of claim 16, wherein the bore area is threaded and configured to accept a fastener to attach the printed circuit board from a side opposite the upper portion.

* * * * *